United States Patent [19]
Maeda et al.

[11] Patent Number: 4,739,402
[45] Date of Patent: Apr. 19, 1988

[54] PROTOCOL CONVERTING APPARATUS FOR VIDEOTEX SYSTEM

[75] Inventors: Satoru Maeda; Akihiko Tao, both of Kanagawa, Japan

[73] Assignee: Sony Corporation, Tokyo, Japan

[21] Appl. No.: 906,257

[22] Filed: Sep. 11, 1986

[30] Foreign Application Priority Data

Sep. 12, 1985 [JP] Japan ................. 60-202452
Sep. 13, 1985 [JP] Japan ................. 60-202737

[51] Int. Cl.$^4$ .............................................. H04N 7/04
[52] U.S. Cl. ...................................... 358/147; 358/142; 379/96
[58] Field of Search ............... 358/147, 142; 379/96; 364/521; 340/748, 750

[56] References Cited
U.S. PATENT DOCUMENTS 4,233,628 11/1980 Ciciora ........................... 358/147
4,439,761 3/1984 Fleming et al. .................. 358/147
4,654,633 3/1987 Tonomura ....................... 358/142

FOREIGN PATENT DOCUMENTS 3038088 4/1982 Fed. Rep. of Germany.
3143627 5/1983 Fed. Rep. of Germany.
1585100 2/1981 United Kingdom.

Primary Examiner—James J. Groody
Assistant Examiner—David E. Harvey
Attorney, Agent, or Firm—Philip M. Shaw, Jr.

[57] ABSTRACT

A protocol converting apparatus in which when character information electronic signals of a NAPLPS (North American Presentation Level Protocol Syntax) system are displayed on a user terminal apparatus of a CAPTAIN (Character And Pattern Telephone Access Information electronic signal Network) system, the overflow condition in a row direction and the overflow condition in a column direction are detected and in which in the case of the overflow condition in a column, an overflow character information electronic signal is temporarily stored in a memory, whereby the NAPLPS character information electronic signal can be used by all user terminals of the CAPTAIN system.

5 Claims, 8 Drawing Sheets

| INVOCATE ALPHABET & NUMERALS | APS(xa,ya) | A |

| APS(xb,yb) | B | APS(xc,yc) | C |
| SET & POLYGON | x1,y1 | x2,y2 | x3,y3 |

FIG. 9B

| DI(C) | INVOCATE ALPHABET & NUMERALS | APS(xa,ya) | A |

| APS(xb,yb) | B | APS(xc,yc) | C |
| DI(T) | PHOTOGRAPHIC DATA |

FIG. 9C

| DI(C) | INVOCATE ALPHABET & NUMERALS | APS(xa,ya) | A |

| APS(xb,yb) | B | APS(xc,yc) | C |
| INVOCATE PDI SET | SET & POLYGON |

| DI(C) | x1,y1 | x2,y2 | x3,y3 |

PROTOCOL CONVERTING APPARATUS FOR VIDEOTEX SYSTEM

BACKGROUND OF THE INVENTION

1. Field of the Invention

This invention relates to a protocol converting apparatus suitable for use with a user terminal apparatus of a CAPTAIN (Character And Pattern Telephone Access Information Network) system and in which the character information of the NAPLPS (North American Presentation Level Protocol Syntax) system can be used by the CAPTAIN user terminal apparatus.

2. Description of the Prior Art

The videotex system can be regarded as a data communication system accompanied with a still image. This videotex system is particularly featured in that the existing telephone network line is used as a transmission line and that a home television receiver is used as a display apparatus. Further, since the videotex system is capable of interactive communication, the videotex system is expected to be used in a wide field of applications. At present, three standard systems of videotex systems, such as, CEPT (Committee European des Postes et Telephone), NAPLPS and CAPTAIN are available in European countries, North America and Japan.

The CAPTAIN system, which is the videotex system in Japan, will be described with reference to FIGS. 1 to 4.

Figure 1A:
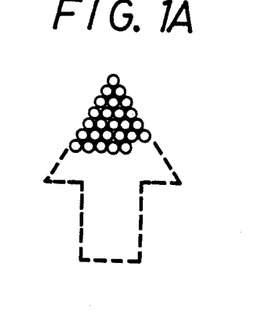
FIGS. 1A to 1C are schematic representations used to explain the different, ways to express a pattern in a videotex system.

According to the CAPTAIN system, fundamentally an alphanumeric character is used as a character and the information thereof is transmitted through a code system. To express a figure or pattern, a "photographic system" is used in which the pattern is expressed with high fidelity by a dot (picture element) pattern as shown in FIG. 1A. Since the CAPTAIN system adopts such a hybrid system, the CAPTAIN system does not require a high processing ability in a user terminal apparatus and can transmit a complex pattern with ease. On the other hand, the amount of information to be transmitted is so much that the transmission rate of the down-link from the CAPTAIN center to the user terminal is selected as 4800 bits/second and that the transmission rate of the up-link from the user terminal to the CAPTAIN center is selected as 75 bits/second.

Figure 1B:
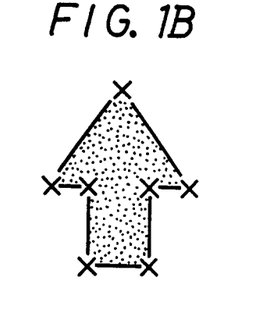
Figure 1C:
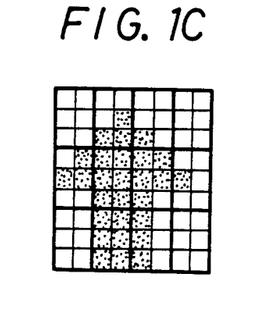

In addition to the above mentioned picture display system, the CAPTAIN system is supported by a "geometric function" which displays the pattern by using dots, straight lines, arcs, polygons and the like as shown in FIG. 1B and a "mosaic function" which displays the pattern by combining mosaic pieces as shown in FIG. 1C.

Figure 2:
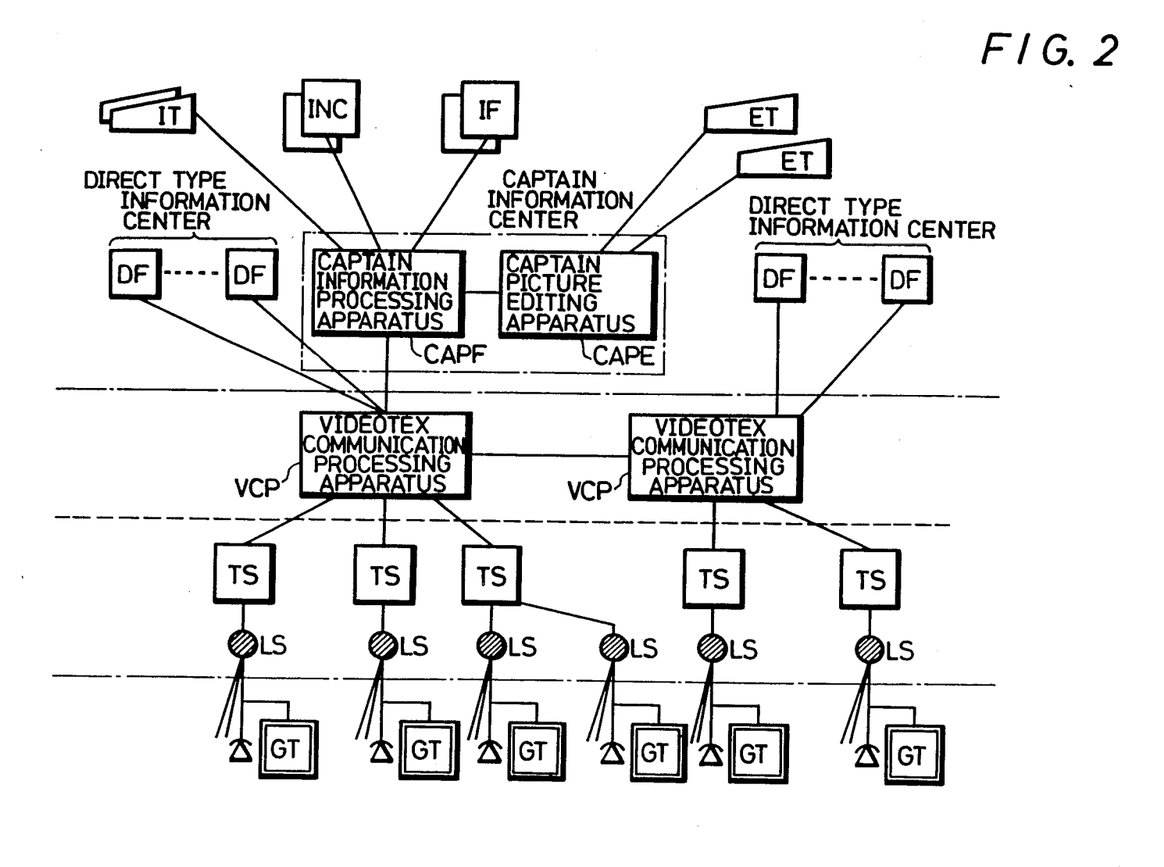
FIG. 2 is a schematic block diagram showing a fundamental arrangement of a CAPTAIN videotex communication system.

The CAPTAIN system is fundamentally formed of an information center, a videotex communication network (telephone network) and a user terminal apparatus as shown in FIG. 2.

Roughly classified, there are known two kinds of information centers, for example, the CAPTAIN information center and a direct type information center DF. An information processing apparatus CAPF of the CAPTAIN information center accumulates picture information supplied from information providers and transmits them to the videotex network. In the direct type information center DF, the making, accumulation and transmission of a picture, the processing of data from a user terminal GT and so on are all carried out by the information provider. An indirect type information center IF and an information input center INC register the picture information to the CAPTAIN center and the accumulation and the transmission of such picture information are carried out by the CAPTAIN center.

Figure 3:
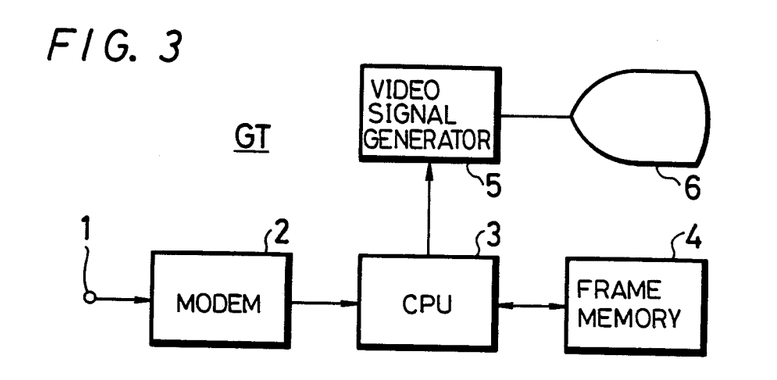
FIG. 3 is a block diagram showing an example of a user terminal apparatus used in the videotex system shown in FIG. 2.

Referring to FIG. 3, the user terminal apparatus GT includes a MODEM (modulator and demodulator) 2, which is connected through an input terminal 1 to a telephone network line (not shown), a computer (CPU) 3, which interprets the picture information from the MODEM 2 and a frame memory 4 in which the picture interpreted by the computer is stored. The picture stored in the frame memory 4 is supplied through a video signal generator 5 to a display 6 and is thereby displayed on the display 6.

The user terminal apparatus are classified into five ranks and the fundamental function, the standard function, the optional function and the like are standardized for each rank of the user terminal apparatus. Referring back to FIG. 2, when the user terminal apparatus GT is connected to the videotex communication network (telephone network line), terminal profile information indicative of the rank and the function of the user terminal itself is transmitted from the user terminal apparatus and a communication processing apparatus VCP in the videotex network carries out the protocol conversion on the basis of the terminal profile information.

The fundamental functions of the user terminal apparatus are indicated in the table 1 below.

TABLE 1

| Rank | Terminal Apparatus | Photo-graphic Pattern information | Character information (including mosaic Pattern information, DRCS information) | Geometric Pattern information |
|---|---|---|---|---|
| 1 | Pattern terminal | available | partly available | not available |
| 2 | Hybrid terminal | available | available | not available |
| 3 | High Density Hybrid terminal | available | available | not available |
| 4 | Command terminal | available | available | available |
| 5 | High Density Command terminal | available | available | available |

For a user terminal apparatus of the ranks 1, 2 and 4, a home television receiver can be used and the number of the picture elements forming a display screen amounts to 192 dots in the longitudinal direction and 248 dots in the lateral direction. On the other hand, for a high density terminal apparatus of the ranks 3 and 5, twice as many dots, that is, picture elements can be displayed (384 dots in the longitudinal direction and 496 dots in the lateral direction) compared to the normal user terminal apparatus of the ranks 1, 2 and 4. The high density user terminal, however, requires a special display.

Figure 4:
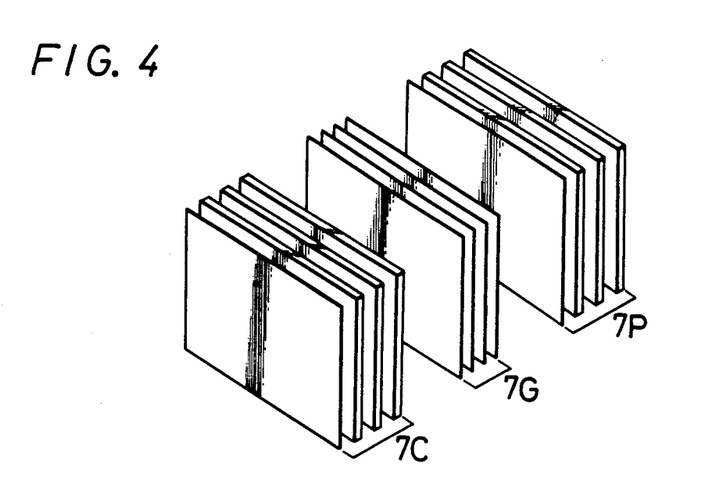
FIG. 4 is a perspective illustration used to explain the arrangement of a display screen of the user terminal apparatus shown in FIG. 3.

As illustrated in FIG. 4, the video or display screen of the display 6 (FIG. 3) is of a multi-frame arrangement in which a plurality of display screens are superposed. Fundamentally, the above mentioned display screen is formed of three frames: a character information frame 7C, which displays a character, a mosaic pattern and DRCS (Dynamically Redefinable Character Set) information, a geometric information frame 7G and a photographic information frame 7P. The priority of their display is also in accordance with this order. The geometric information frame 7G is the dot unit coloring system frame, while the character information frame 7C and the photographic information frame 7P are each block coloring system frames.

Information that can be expressed by the CAPTAIN system is indicated in the following table 2.

TABLE 2

| Data Syntax Items | CAPTAIN Japan |
|---|---|
| Main Display Function Character/Symbol Display Function | Alphaphotographic Alphabets, Numerals, Symbols Japanese Syllabary, Japanese Cursive Syllabary, Chinese character |
| Pattern Display Function | |
| Photographic | YES (CAPTAIN system) |
| Geometric | YES (based on NAPLPS system) |
| Mosaic | Based on CEPT mosaic & mosaic special to CAPTAIN |
| Special Pattern (DRCS) | YES (special to CAPTAIN) |
| Standard Coloring Unit | |
| character/mosaic | character unit block coloring |
| Geometric | Dot coloring |
| Photographic | Block (4 × 4 dots) |
| Number of display Characters | Standard 15 columns × 8 rows (Chinese character) 31 columns × 16 rows (English letters, numerals and Japanese Cursive Syllabary) |
| Number of colors displayed simultaneously | 16 colors |

Various kinds of information in the CAPTAIN system are transmitted through the following 4 code systems.
(1) Code mode code system
(2) Transparent mode code system
(3) Melody mode code system
(4) Message mode code system Of these code systems (1) to (4), the former two code systems (1) and (2) are displayed on the afore-mentioned respective frames. The respective modes are changed-over by using a DI code of one byte. The DI codes indicating the code mode and the transparent mode are DI (C) and DI (T), respectively.

In the code mode code system of the CAPTAIN system, there are used the following code sets and others.
(a) Character code set
(b) Mosaic set
(c) DRCS
(d) PDI (Picture Description Instruction) set
(e) Others The character code set consists of Chinese character set such as Chinese characters according to JIS C6226 and the like, English letter and numeral set indicating English letters and numerals and Japanese Syllabary set indicating the Japanese Syllabary according to JIS C6200. The Chinese character set uses a two-byte system code.

The 8-unit code can express 256 kinds of codes at maximum so that the CAPTAIN system uses the codes extended in accordance with ISO (International Organization for Standardization) standard 2022.

The In-Use-Table used to extend the codes as described above is formed of 16 rows and 16 columns and the 16 columns are separated into 4 sets of the C0 (0th to first columns), GL (second to seventh columns), C1 (eighth to ninth columns) and GR (tenth to fifteenth columns). In the GL and GR of the above mentioned In-Use-Table, of the G0, G1, G2 and G3 sets which are defined as the graphic sets, various kinds of code sets, which are prepared as the graphic repertory, are designated into any one of the 4 sets of G0 to G3. Further, the code sets designated in the G0 to G3 sets are invoked to the GL set or GR set on the In-Use-Table. In this case, the control codes are set in the C0 and C1 sets on the In-Use-Table.

The PDI is based on the NAPLPS which is the videotex system used in the North America and used to describe the pattern by using geometrical elements and coordinate points. As the fundamental patterns, there are provided a POINT, a LINE, an ARC, a RECTANGLE and a POLYGON.

According to the PDI set, one geometric figure is expressed by the combination of the operator code and the operand. The operator code is mainly used to designate the pattern element, while the operand is used to designate the coordinate point. The control command of the PDI set is used to select the color for the geometrical pattern.

In the transparent mode as earlier described, the information is transmitted as the unit of PDU (photographic data unit). The PDU includes one-bit photo-operator code and a photo-operand and the operand portion is formed of a parameter and a data. The photo operator code is a code to identify what the PDU data means and expresses the scanning range, the existence of the data compression, the coloring and the like. The parameter is the portion which supplements the operator code and the code of one to several bytes to describe the data indication coordinate and the details of the data content.

The NAPLPS system uses an alphanumeric as the character and the pattern is fundamentally expressed by using the afore-mentioned PDI and according to the "geometric system" shown in FIG. 1B. The NAPLPS system has the mosaic function and the independent DRSC function. In the NAPLPS system, the transmission rate of the down-link is selected as 1200 bits/second and the transmission rate of the up-link is 150 bits/second.

In Japan, independently of the public type CAPTAIN system, the NAPLPS system is used as a local area information system and an industrial information system.

The following table 3 indicates the information that can be expressed by the NAPLPS system.

TABLE 3

| Data Syntax Items | NAPLPS North America |
|---|---|
| Main Display Function Character/Symbol Display Function | Alphageometric Alphabets, Numerals and Symbols |
| Pattern Display Function | |
| Photographic | NO (Substituted by incremental point) |
| Geometric | YES (NAPLPS system) |
| Mosaic | Part of CEPT mosaic |
| Special Pattern (DRCS) | YES (special to NAPLPS) |
| Standard Coloring Unit | |
| character/mosaic | Character unit block coloring |
| Geometric | Dot coloring |
| Photographic | |
| Number of Display | Standard |

TABLE 3-continued

| Data Syntax Items | NAPLPS North America |
|---|---|
| Characters | 40 columns × 20 rows |
| Number of colors displayed simultaneously | 16 colors |

Since the CAPTAIN and the NAPLPS are different systems, even if the information system of the NAPLPS system exists in Japan as described before, it is not possible to make an access of the NAPLPS information center (data base) using a CAPTAIN user terminal.

The character display ability of the NAPLPS system exceeds the CAPTAIN system with respect to any one of the number of rows and the number of columns. Accordingly, even when the access is made possible by the protocol conversion, an overflow condition of the characters to be displayed occurs so that one portion of the information will be dropped.

OBJECTS AND SUMMARY OF THE INVENTION

Accordingly, it is an object of this invention to provide an improved protocol converting apparatus which can overcome the shortcomings encountered with prior art protocol converting apparatus.

It is another object of this invention to provide a protocol converting apparatus by which first picture information according to a first protocol of a first videotex standard, such as NAPLPS, for example, is converted to second picture information according to a second protocol of a second videotex standard, such as CAPTAIN, for example.

It is further object of this invention to provide a protocol converting apparatus in which first picture information according to the first protocol of the first videotex standard can be used by a user terminal according to the second protocol.

According to one aspect of the present invention, there is provided a protocol converting apparatus for converting first picture information according to the first protocol of the first videotex standard to second picture information according to the second protocol of the second videotex standard, comprising:
(a) receiving means for receiving said first picture information;
(b) separating means for separating said first picture information into character information and graphic information, said character information having position data indicating the display position by row and column of said character information;
(c) position data converting means for converting the position data of said character information from said separating means into new position data for a user terminal of said second videotex standard, said position data converting means further including:
  (i) first overflow detecting means responsive to said position data of said character information for detecting an overflow condition in a column direction beyond the capacity of a user terminal of said second videotex standard for displaying characters within one column and for generating a change line signal in response thereto; and
  (ii) second overflow detecting means responsive to said change line signal for detecting an overflow condition in a row direction beyond the capacity of a user terminal of said second videotex standard for displaying character rows within one frame and for generating a change frame signal in response thereto;
(d) access code generating means for generating a next page access code in response to the change frame signal;
(e) discriminating means for discriminating the signal from the user terminal of said second videotex standard generated by the operation of a next page access key therein and for generating an output signal in response thereto;
(f) memory means responsive to both the discriminating means output signal and the change frame signal for storing the character information; and
(g) transmitting means connected to the memory means for transmitting at least the character information together with the new position data, wherein said memory means stores the overflow character information in response to the change frame signal, the next page access code generated by said access code generating means is transmitted to said user terminal of the second videotex standard, and the character information stored in said memory is read out from said memory in response to the output signal of the discriminating means and supplied to said transmitting means.

These and other objects, features and advantages of the present invention will become apparent from the following detailed description of the preferred embodiment taken in conjunction with the accompanying drawings, throughout which like reference numerals designate like elements and parts.

DESCRIPTION OF THE PREFERRED EMBODIMENT

Figure 5:
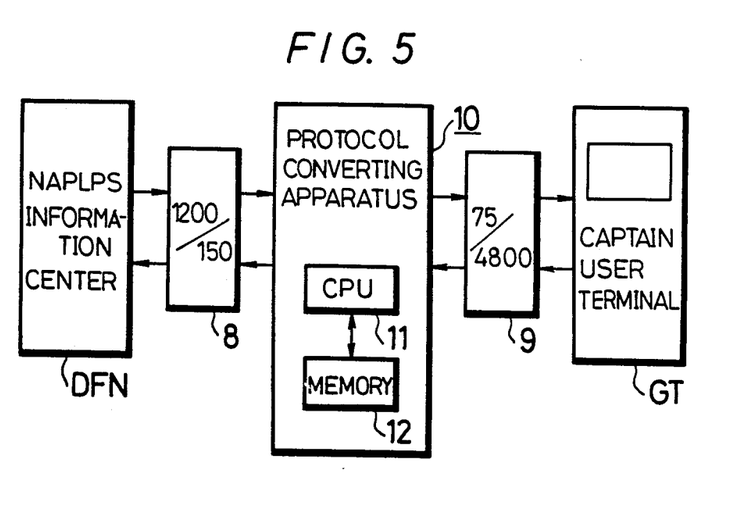
FIG. 5 is a schematic block diagram showing the working environment and relative position of one embodiment of a protocol converting apparatus according to the invention.

One embodiment of a protocol converting apparatus according to this invention will now be described with reference to FIGS. 5 to 11. FIG. 5 is a schematic representation of the working environment and relative position of the protocol converting apparatus according to this embodiment.

In FIG. 5, reference numeral 10 generally designates the protocol converting apparatus of this embodiment. The protocol converting apparatus 10 is connected between a NAPLPS information center DFN and the CAPTAIN user terminal GT through center MODEMs 8 and 9. The protocol converting apparatus 10 includes a computer (CPU) 11 and a memory 12. This protoool converting apparatus 10 receives the picture information accessed by the user terminal apparatus GT from the information center DFN, carries out a proper conversion process thereof, which will be described later and then transmits the same to the user terminal apparatus GT.

Figure 6A:
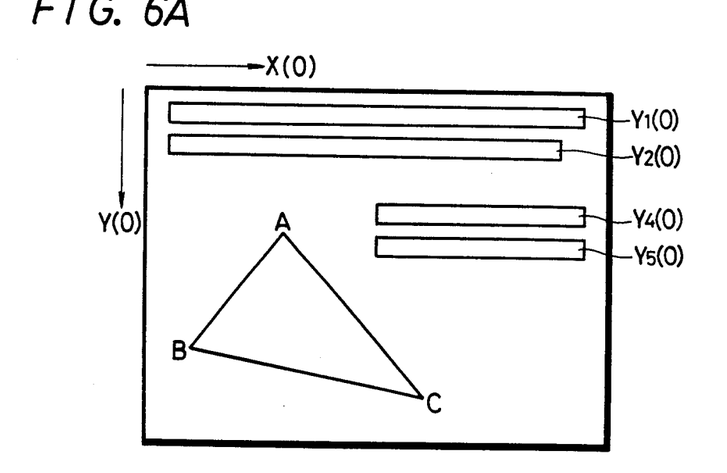
FIGS. 6A and 6B are respectively conceptual diagrams used to explain the conversion of a picture on the display screen of the user terminal.

Let it be assumed that the picture information from the NAPLPS information center DFN includes the pattern information for a triangle ABC and original character information of Y1(0) to Y2(0) and Y4(0) to Y5(0) as, for example, shown in FIG. 6A.

Figure 6B:
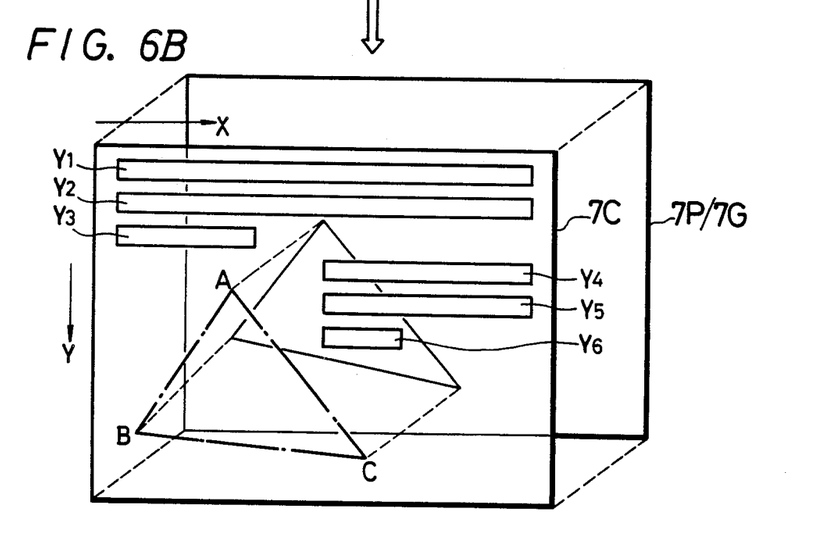

Although the display screen of the NAPLPS system is formed of only the geometric information frame as described before, the display screen of the CAPTAIN system is formed of a multi-frame arrangement (FIG. 4) so that after the protocol conversion of the picture information, the character information is displayed on the character information frame 7C and the picture information is displayed on the photographic information frame 7P or the geometric information frame 7G in response to the rank of the terminal apparatus as shown in FIG. 6B.

Further, the original character information of the NAPLPS is displayed over Y1 to Y3 and Y4 to Y6.

Figure 7:
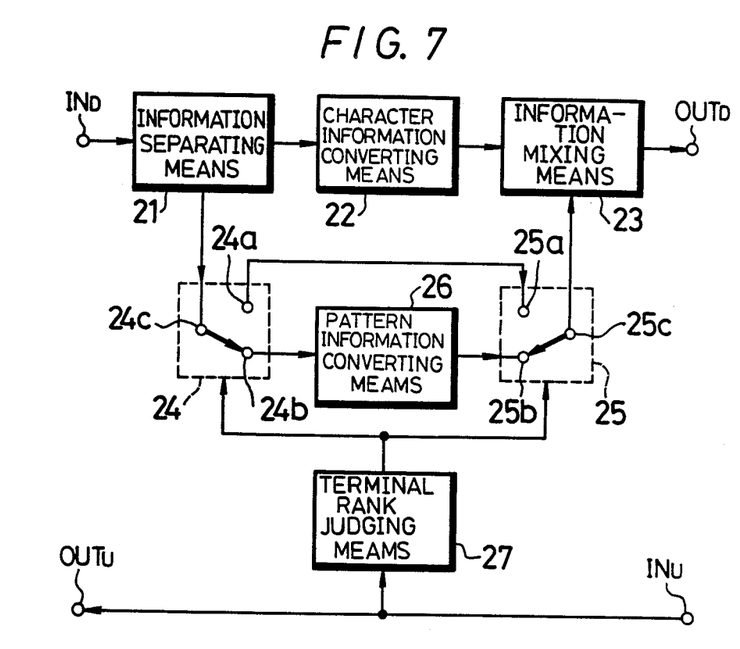
FIG. 7 is a function block diagram used to explain the separation means.

To this end, according to this embodiment of the invention, the following protocol conversion is carried out. Referring to FIG. 7, the NAPLPS picture information through a down-link input terminal IND is supplied to information separating means 21 and one output of the information separating means 21 is supplied through a character information converting means 22 to one input terminal of information mixing means 23. The other output of the information separating means 21 is supplied to a movable contact 24c of a first switch 24. One fixed contact 24a of the first switch 24 is connected directly to one fixed contact 25a of a second switch 25. The other fixed contact 24b of the first switch 24 is connected through pattern and information converting means 26 to the other fixed contact 25b of the second switch 25. A movable contact 25c of the second switch 25 is connected to the other input terminal of the information mixing means 23. The output from the information mixing means 23 is supplied to a down-link output terminal $OUT_D$. The output from terminal rank identifying means 27, whose input is connected to an up-link input terminal $IN_U$, is supplied to both the first and second switches 24 and 25 as a control signal.

Figure 8:
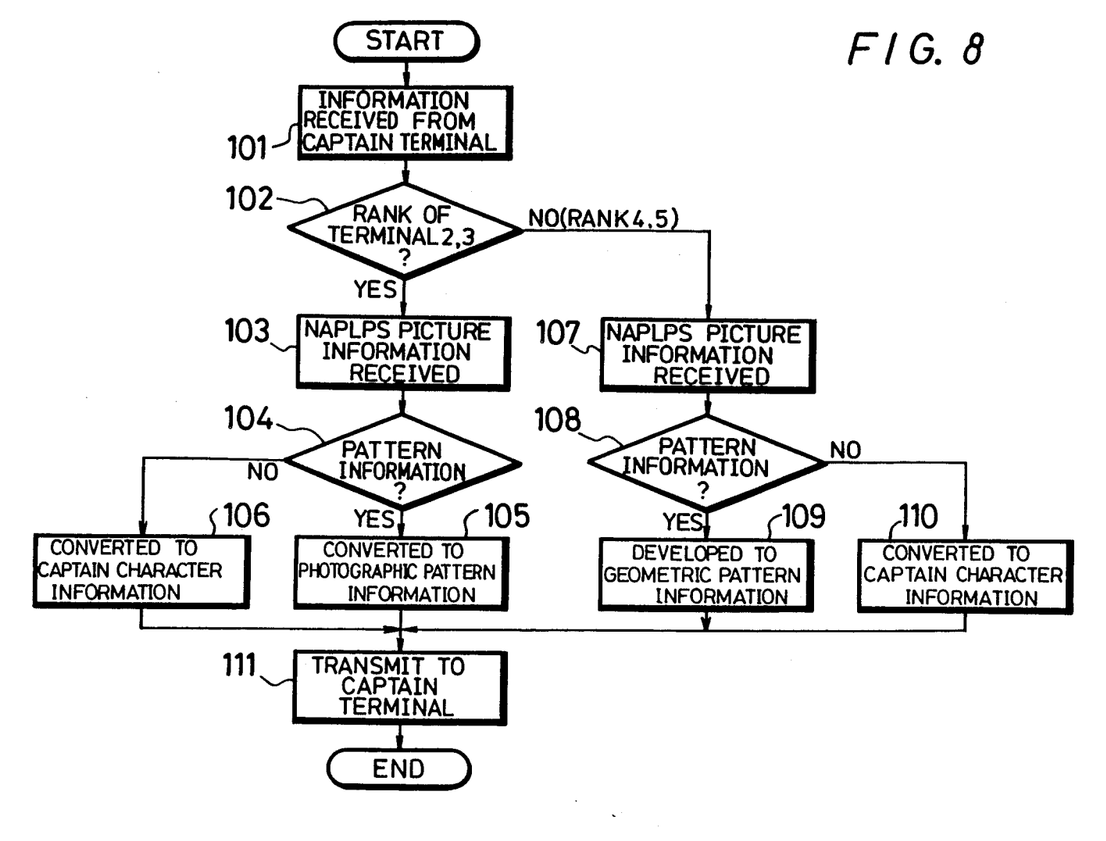
FIG. 8 is a flow chart used to explain the operation of the separation means.

The separation display operation will now be described with reference to the flow chart of FIG. 8.

When the terminal profile information reaches the up-link input terminal $IN_U$ from the CAPTAIN terminal GT (FIG. 2) at step 101, the rank of the user terminal apparatus is identified by the terminal rank identifying means 27 at step 102. When the rank of the user terminal is 2 or 3, the first and second switches 24 and 25 are both connected in the illustrated state in FIG. 7. When the rank of the user terminal is 4 or 5, the first and second switches 24 and 25 are connected in the state opposite to the illustrated state in FIG. 7.

When the rank of the user terminal is 2 or 3, if the NAPLPS picture information arrives at the down-link input terminal $IN_D$ at step 103, the information separating means 21 determines whether the above mentioned picture information is pattern information or character information and the picture information is divided into the component parts of pattern information and character information at step 104. The separated geometric system pattern information is converted to a photographic pattern information by the pattern information converting means 26 so as to be displayed on the photographic information frame 7P at step 105. On the other hand, the separated code system character information is converted by the character information converting means 22 so as to be displayed on the character information frame 7C at step 106.

When the rank of the user terminal is 4 or 5, if the NAPLPS picture information arrives at the down-link input terminal $IN_D$ (at step 107), the information separating means 21 determines whether the picture information is pattern information or character information and the picture information is separated into the pattern information and character information components at step 108. The separated geometric system pattern information is developed as is at step 109, that is, the pattern information converting means 26 is bypassed by the switches 24 and 25. On the other hand, the code type character information separated at step 108 is converted by the character information converting means 22 so as to be displayed on the character information frame 7C similarly to the step 106 at step 110.

The character information and the pattern information converted as described above are supplied to the information mixing means 23 (FIG. 7) in which they are mixed at a proper timing and the mixed information is transmitted from the down-link output terminal $OUT_D$ at step 111, which is then displayed on the CAPTAIN user terminal as shown in FIG. 6B.

In this case, although it may be considered that the character information is displayed on the geometric information frame 7G, the data transmitted via the character code has to be displayed as the NAPLPS data by using the PDI set so that the transmission rate and the display speed are both lowered.

Figure 9A:
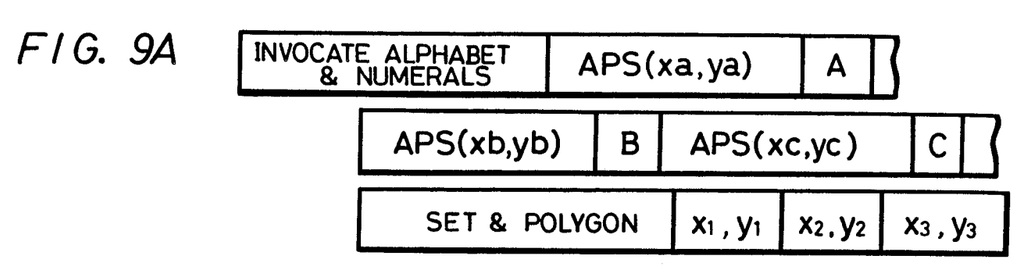
FIGS. 9A to 9C are schematic representations respectively showing the arrangement of data used in the invention.
Figure 9B:
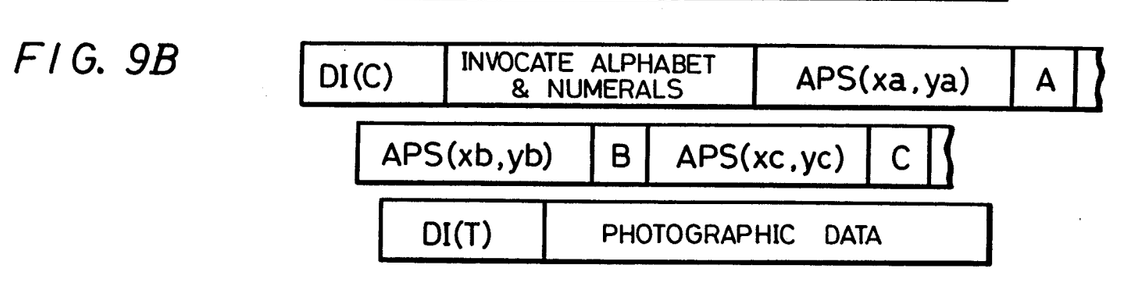
Figure 9C:
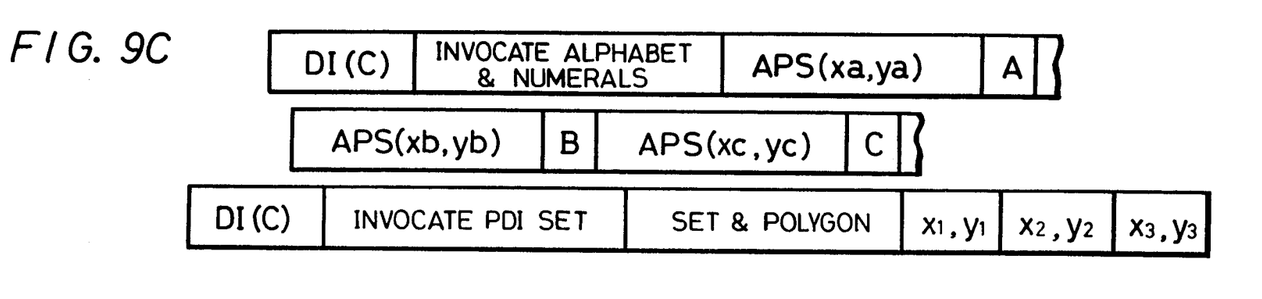

The characters, which indicate the triangle and the respective vertexes thereof shown in FIGS. 6A and 6B, are transmitted through the data shown in FIGS. 9A, 9B and 9C. According to the NAPLPS system, at first the English letter and numeral code is invocated by the data shown in FIG. 9A, whereby characters A, B and C are respectively written at coordinates (xa, ya); (xb, yb); and (xc, yc) set by an APS (active position set) code of the C0 control set. Then, the coordinates (x1, y1); (x2, y2); and (x3, y3) indicating the respective vertexes of the triangle are designated and according to the command POLYGON to make the pattern, the triangle is made by connecting the respective vertexes.

In the user terminal having the rank 2 or 3 in the CAPTAIN system, as shown in FIG. 9B, the code mode is indicated by the DI (C) code and then similarly to the case of the NAPLPS system, the characters A, B and C are respectively written at the coordinates designated on the character information frame 7C. Then, the fact that the code mode is changed-over to the transparent mode is indicated by the DI (T) code, whereby a triangle is drawn on the photographic information frame 7P by the photographic data.

Further, in the CAPTAIN user terminal having the rank 4 or 5, as shown in FIG. 9C, the characters A, B and C are drawn on the character information frame 7C in exactly the same way as in the case of the rank 2 or 3. Subsequently, under the state of the code mode, the PDI (picture description instruction) set is invocated and similarly to the case of the NAPLPS system, a triangle is formed on the geometric information frame 7G by connecting the respective vertexes.

The display of the character information according to the embodiment of the present invention will now be described with reference to FIGS. 10 and 11.

Figure 10:
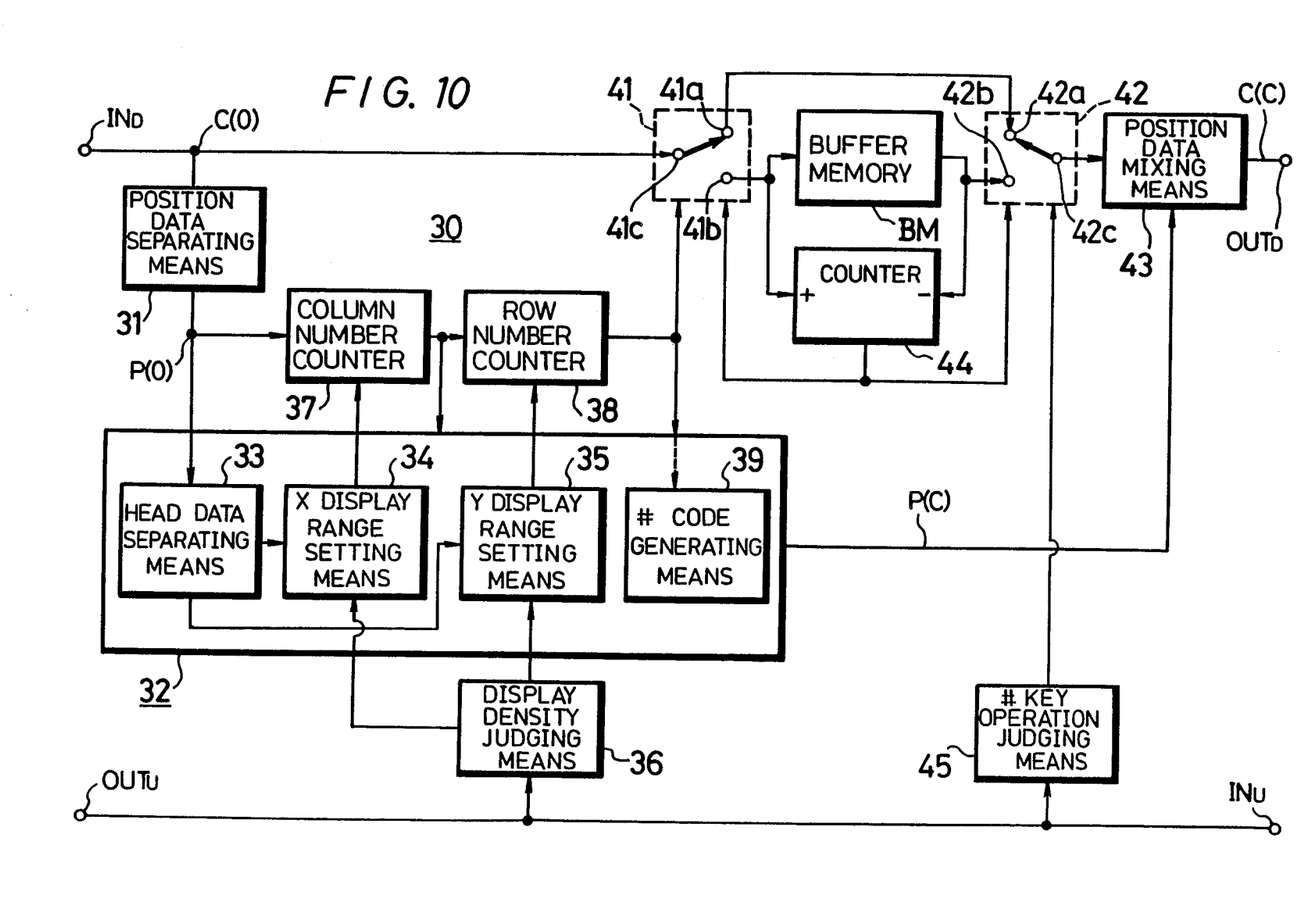
FIG. 10 is a function block diagram showing one embodiment of the protocol converting apparatus according to the present invention.
Figure 11:
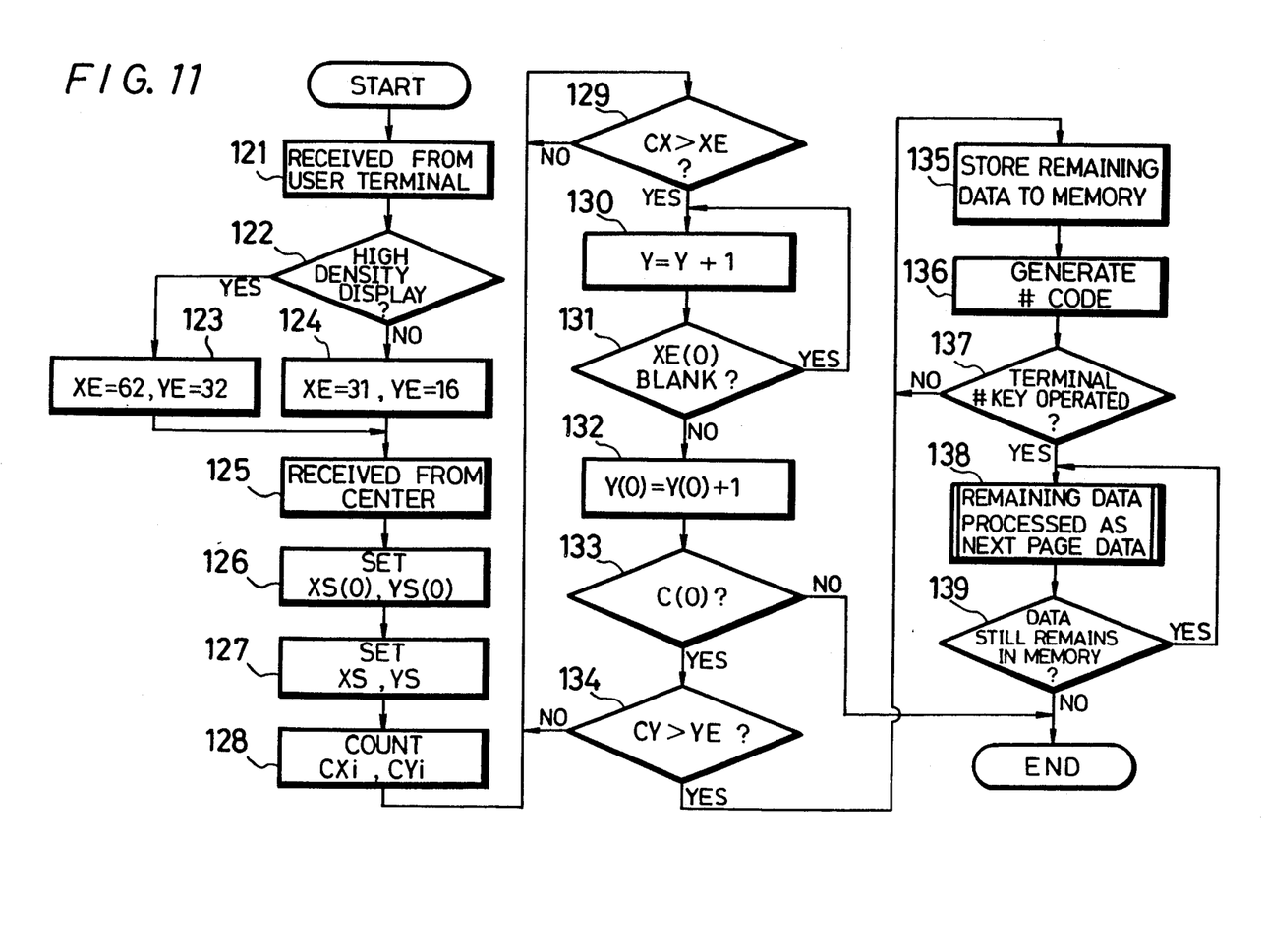
FIG. 11 is a flow chart used to explain the operation of the embodiment of the invention shown in FIG. 10.

FIG. 10 is a function block diagram of this embodiment. Reference numeral 30 designates generally a character display position converting apparatus. An original character information C (O) transmitted from the information center is supplied through the down-link input terminal $IN_D$ to a position data separating means 31. The output from this position data separating means 31, that is, an original position data P (O) is supplied to head data separating means 33 of display range control means 32. The output of the head data separating means 33 is supplied to both X display range setting means 34 and Y display range setting means 35. To both the display range setting means 34 and 35, there is supplied an output of display density judging means 36 connected to the up-link input terminal $IN_U$.

Reference numeral 37 designates a column number counter which is used as detecting means for detecting the overflow condition in a column direction. Reference numeral 38 designates a row number counter which is used as detecting means for detecting the overflow condition in a row direction. The output P (O) of the position data separating means 31 is supplied to the column number counter 37, while the output of the column number counter 37 is supplied to the row number counter 38. The outputs of both the counters 37 and 38 are supplied to the display range control means 32 and the counters 37 and 38 are respectively supplied with the outputs of the X and Y display range setting means 34 and 35 as control signals. Reference numeral 39 designates # code generating means which is responsive to the output of the row number counter 38.

Reference numerals 41 and 42 designate electronic switches and reference letter BM designates a buffer memory. Separate fixed contacts 41a and 42a of each of the switches 41 and 42, respectively, are coupled to each other directly, while the other fixed contacts 41b and 42b thereof are respectively connected to the input terminal and the output terminal of the buffer memory BM. A movable contact 41c of the first switch 41 is connected to the down-link input terminal $IN_D$ and a movable contact 42c of the second switch 42 is connected to one input terminal of position data mixing means 43. The position data mixing means 43 is supplied at its other input terminal with the output P (C) of the display range control means 32 and the output of the position data mixing means 43, that is, the conversion character information C (C) is supplied to the down-link output terminal $OUT_D$.

The input to and the output from the buffer memory BM are supplied to a counter 44 and the output of the counter 44 is supplied commonly to both the first and second switches 41 and 42 as the reset control signal. Further, as the set control signal, the output of the row number counter 38 is supplied to the first switch 41 while the output of a # key operation judging means 45, whose input is connected to the up-link input terminal $IN_U$, is supplied to set the second switch 42.

The operation of this embodiment will now be described with reference to the flow chart of FIG. 11. In the following explanation, Xi(O) represents the X coordinate of the original character information (number of characters); Yj(O) represents the Y coordinate of the original character information (number of rows); Xi represents the X coordinate of the conversion character information (number of characters); Yj represents the Y coordinate of the conversion character information (number of rows); S represents the head position (standard value); and E represents the end position as shown in FIG. 11.

When the operation is started, both the first and second switches 41 and 42 are connected in the illustrated state in FIG. 10. When the terminal profile information arrives at the up-link input terminal $IN_U$ (at step 121), it is judged by the display density judging means 36 whether the user terminal is in the density display (rank 3 or 5) or the standard density display (rank 2 or 4) at step 122. When it is the high density, XE=62 and YE=32 are established (at step 124). When it is the standard density, XE=31 and YE=18 are established (at step 124). When the original character information C (O) arrives at the down-link input terminal $IN_D$, the position data P (O) is separated by the position data separating means 31 (at step 125). This original position data P (O) is supplied to the head data separating means 33 by means of which the head position data XS (O) and YS (O) for a character information series Y1(O) to Y2(O) and Y4(O) to Y5(O) shown in FIG. 6A are separated (at step 126). Both data XS (O) and XE are supplied to the X display range setting means 34 in which the display ranges XS to YS in the user terminal are set and both the data YS (O) and YE are supplied to the Y display range setting means 35 in which the display ranges YS to YE in the user terminal are set (at step 127). Then, the numbers of the display rows and display columns are preset in both the counters 37 and 38. When the head of the original character information exists in the midst of the row on the display screen as in the Y4 (O) shown in FIG. 6A, in order to avoid the overlapping of the pattern information, the head display position of the character information converted is selected to be the same value as the standardized coordinate of the original character information.

The number of the position data Pij(O) separated by the position data separating means 31 is the same as that of the original character information Cij (O). First, the number CX1 of the position data Pi1(O) on the first row is counted by the column number counter 37 (at step 128). If the counted value CX1 exceeds the preset value |XE−XS| of the counter 37 (step 129) a column overflow detection (change line) signal is generated from the counter 37. This change line signal is supplied from the display range control means 32 to the position data mixing means 43 as one portion of the conversion position data P (C). The position data of the original character information C (O) after the change line signal is generated is converted from the P (O) to C (O) and the Cil (O) is changed in line and displayed in the user terminal (at step 130). If the end YE (O) of the Y1 (O)

is blank, it is judged that the information of Y2 (O) and the information of Y1 (O) are not continuous, and the display of the user terminal is changed further in line. If on the other hand the YE (O) is not blank, it is judged that the information of Y2 (O) which is changed in line from the Y1 (O) is continuous to the Y1 (O). Accordingly, they are successively displayed in the user terminal (at steps 131 and 132). If the character information C (P) exists continuous to the original picture whose line is changed (at step 133), the change line signal of the column number counter 37 is counted by the row number counter 38. Then, until the counted value CY thereof exceeds the preset value |YE−YS| of the counter 38, the above mentioned operation is repeatedly carried out. When the CY exceeds the preset value, the row overflow detection (change frame) signal is generated from the counter 38 (at step 134).

By this frame change signal, the first switch 41 is connected to the state opposite to the illustrated state in FIG. 10 and the transmission of the character information to the user terminal is stopped. Then, the original character information C (O) is stored in the buffer memory BM (at step 135). At the same time, the # code generating means 39 generates the # code (the next page access symbol of the CAPTAIN system) and the # symbol is displayed on the user terminal (step 136). When the user depresses a # key on the user terminal in response to the display of the # symbol, a # key signal arrived at the up-link input terminal INU is judged by the # key operation judging means 45 (at step 137). Then, the judged signal is supplied to the second switch 42 so that the second switch 42 is connected to the state opposite to the illustrated state in FIG. 10. Thus, the character information C (O) stored in the buffer memory BM is read out, transmitted to the user terminal and processed as the next page data by the user terminal similarly as described above (at step 138). The number of the input and output data of the buffer memory BM is counted by the counter 44. When all data stored in the buffer memory BM are read out, the counted value of the counter 44 becomes zero and the reset signal is delivered therefrom so that the first and second switches 41 and 42 are both connected to the illustrated state again, thus ending the conversion processing of the position data (at step !39). If the counted value of the counter 44 does not become zero, the program goes back to step 138 in which the above mentioned operation is carried out again.

According to the present invention as set forth above, the overflow condition in the row direction and the overflow condition in the column direction are both detected. Also, if the overflow condition in the frame is detected, the overflow character information is temporarily stored in the buffer memory so that the high density character information of the NAPLPS system can be displayed on either one of the user terminal apparatus of the CAPTAIN system.

While in the above mentioned embodiment the counters 37 and 38 are used as the overflow detecting means, a modified version is possible, by way of example, in which the original position information and the display setting range are compared to thereby detect the coincidence thereof.

When the character information and the graphic information are transmitted through the same picture as shown in FIG. 6A, only the character information is converted as mentioned above, while the graphic information is processed independently in accordance with the display density of the user terminal.

The above description is given on a single preferred embodiment of the invention but it will be apparent that many modifications and variations could be effected by one skilled in the art without departing from the spirits or scope of the novel concepts of the invention so that the scope of the invention should be determined by the appended claim only.

We claim as our invention:

1. For a videotex system of the type having user terminals and which processes picture information electronic signals according to predetermined videotex standards, a protocol converting apparatus for converting first picture information electronic signals according to a first protocol of a first videotex standard to second picture information electronic signals according to a second protocol of a second videotex standard, comprising:
 (a) receiving means for receiving said first picture information electronic signals;
 (b) separating means for separating said first picture information electronic signals into character information electronic signals and graphic information electronic signals, said character information electronic signals having position data indicating the display position by row and column of said character information electronic signals;
 (c) position data converting means for converting the position data of said character information electronic signals from said separating means into new position data for a user terminal of said second videotex standard, said position data converting means further including:
  (i) first overflow detecting means responsive to said position data of said character information electronic signals for detecting an overflow condition in a column direction beyond the display capacity of the user terminal of said second videotex standard and for generating a change line signal in response thereto; and
  (ii) second overflow detecting means responsive to said change line signal for detecting an overflow condition in a row direction beyond the capacity of the user terminal of said second videotex standard for displaying character rows within one frame and for generating a change frame signal in response thereto;
 (d) access code generating means for generating a next page access code in response to the change frame signal;
 (e) discriminating means for discriminating the signal from the user terminal of said second videotex standard generated by the operation of a next page access key therein and for generating an output signal in response thereto;
 (f) memory means responsive to both the discriminating means output signal and the change frame signal for storing overflow character information electronic signals; and
 (g) transmitting means connected to the memory means for transmitting at least the character information electronic signals together with the new position data, wherein the next page access code generated by said access code generating means is transmitted to said user terminal of the second videotex standard, and the overflow character information electronic signals stored in said memory means are read out from said memory means in response to the output signal of the discriminating means and supplied to said transmitting means.

2. A protocol converting apparatus as recited in claim 1 for use in a videotex system, wherein a plurality of user terminals of the second videotex standard are classified into a predetermined number of ranks and further comprising means for determining the rank of the user terminal of the second videotex standard and for setting overflow conditions in the first and second overflow detecting means as a function the determined rank of the user terminal.

3. A protocol converting apparatus as recited in claim 1 for use in a videotex system, wherein a plurality of user terminals of the second videotex standard are classified into a predetermined number of ranks and further comprising means for determining the rank of the user terminal of the second videotex standard and for generating a terminal rank output signal corresponding thereto, and wherein the separating means further includes means for converting the separated graphic information electronic signals into photographic pattern information electronic signals when the rank output signal indicates the user terminal is a predetermined rank and for passing the graphic information electronic signal unchanged if the rank output signal indicates the user terminal is not of the predetermined rank.

4. A protocol converting apparatus for use in a videotex system as recited in claim 1, wherein the first videotex standard is the NAPLPS system and the second videotex standard is the CAPTAIN system.

5. For a videotex system of the type having user terminals and which processes picture information electronic signals according to predetermined videotex standards, a method for converting first picture information electronic signals according to a protocol of a first videotex standard to second picture information electronic signals according to a protocol of a second videotex standard, comprising the steps of:
(a) receiving said first picture information electronic signals;
(b) separating said first picture information electronic signals into character information electronic signals and graphic information electronic signals, said character information electronic signals having position data indicating the display position by row and column of said character information electronic signals;
(c) converting the position data of said separated character information electronic signals into new position data for a user terminal of said second videotex standard, said position data converting step further including the steps of:
 (i) a first overflow detecting step in which the position data of said character information electronic signals is sensed to determine if there exists an overflow condition in a column direction beyond the display capacity of the user terminal of said second videotex standard and generating a change line signal if such a condition does exist; and
 (ii) a second overflow detecting step in which the presence of the change line signal is sensed to determine if there exists an overflow condition in a row direction beyond the capacity of, the user terminal of said second videotex standard for displaying character rows within one frame and for generating a change frame signal if such a condition does exist;
(d) generating a next page access code in response to the change frame signal;
(e) discriminating a signal from the user terminal of said second videotex standard generated by the operation of a next page access key therein and generating an output signal in response thereto;
(f) transmitting to the user terminal at least the character information electronic signals together with the new position data;
(g) storing overflow character information electronic signals in response to the change frame signal;
(h) transmitting the next page access code signal to said user terminal of the second videotex standard;
(i) reading out and transmitting the stored character information electronic signals stored in response to the output signal generated by the discriminating step.

* * * * *